(12) United States Patent
Goeke

(10) Patent No.: US 10,663,490 B2
(45) Date of Patent: May 26, 2020

(54) NESTED AMMETER

(71) Applicant: KEITHLEY INSTRUMENTS, LLC, Solon, OH (US)

(72) Inventor: Wayne C. Goeke, Hudson, OH (US)

(73) Assignee: Keithley Instruments, LLC, Solon, OH (US)

( * ) Notice: Subject to any disclaimer, the term of this patent is extended or adjusted under 35 U.S.C. 154(b) by 211 days.

(21) Appl. No.: 15/199,273

(22) Filed: Jun. 30, 2016

(65) Prior Publication Data

US 2018/0003741 A1    Jan. 4, 2018

(51) Int. Cl.
| | | |
|---|---|---|
| G01R 15/14 | (2006.01) | |
| G01R 19/00 | (2006.01) | |
| G01R 1/20 | (2006.01) | |
| H03F 3/45 | (2006.01) | |

(52) U.S. Cl.
CPC .......... *G01R 15/146* (2013.01); *G01R 1/203* (2013.01); *G01R 19/0023* (2013.01); *G01R 19/0092* (2013.01); *H03F 3/45475* (2013.01); *H03F 2200/261* (2013.01); *H03F 2203/45138* (2013.01)

(58) Field of Classification Search
CPC .... H03F 3/45; H03F 3/45071; H03F 3/45076; H03F 3/45475; G01R 1/20; G01R 1/203; G01R 15/12; G01R 15/125; G01R 19/0023; G01R 19/0092; G01R 19/25–2509
See application file for complete search history.

(56) References Cited

U.S. PATENT DOCUMENTS

| | | | | |
|---|---|---|---|---|
| 4,559,502 | A * | 12/1985 | Hiujsing | H03F 1/083 330/109 |
| 5,880,827 | A * | 3/1999 | Heinke | G01R 15/09 323/226 |
| 6,429,641 | B1 * | 8/2002 | Montrose | G01R 19/2509 323/277 |
| 7,023,271 | B1 * | 4/2006 | Aram | H03F 1/08 330/69 |
| 7,173,486 | B1 * | 2/2007 | Sutardja | H03F 1/08 250/214 A |
| 7,304,536 | B1 * | 12/2007 | Sutardja | H03F 1/08 330/69 |
| 7,701,227 | B2 * | 4/2010 | Saulnier | A61B 5/0536 324/601 |
| 8,143,881 | B2 * | 3/2012 | Chen | G01R 19/0092 323/220 |
| 2002/0121929 | A1 * | 9/2002 | Gropl | H03F 1/0277 330/69 |

(Continued)

*Primary Examiner* — Huy Q Phan
*Assistant Examiner* — David B Frederiksen
(74) *Attorney, Agent, or Firm* — Miller Nash Graham & Dunn; Andrew J. Harrington

(57) ABSTRACT

A nested ammeter for measuring the electrical current flowing through a device under test (DUT) can include an input configured to receive an input signal having a frequency within a frequency band and representing the electrical current flowing through the DUT. The nested ammeter can also include an output configured to generate an output voltage representing the electrical current flowing through the DUT. An active shunt can be used as the resistive feedback of the ammeter. A nested active shunt can be used as the resistive feedback element of the active shunt.

11 Claims, 7 Drawing Sheets

(56) References Cited

U.S. PATENT DOCUMENTS

| | | | |
|---|---|---|---|
| 2006/0055456 A1* | 3/2006 | Niederkorn | H03F 1/02 330/9 |
| 2007/0103232 A1* | 5/2007 | Chen | H03F 1/08 330/109 |
| 2008/0087544 A1* | 4/2008 | Zhou | G01N 27/48 204/406 |
| 2008/0111560 A1* | 5/2008 | Regier | G01R 19/0023 324/609 |
| 2009/0273338 A1* | 11/2009 | Goeke | G01R 15/09 324/115 |
| 2011/0140945 A1* | 6/2011 | Sundblad | H03F 3/45475 341/155 |
| 2014/0111188 A1* | 4/2014 | Goeke | H03F 3/45475 324/123 R |

* cited by examiner

NESTED AMMETER

TECHNICAL FIELD

The disclosed technology relates generally to electrical measurement equipment and, in particular, to ammeters for use in measuring electrical current.

BACKGROUND

Ammeters are often a sub component of electrical measurement products including digital multi-meters (DMMs) and source measure units (SMUs). There are several ways in which the current through a device under test (DUT) may be measured. SMUs are generally used to make precision measurements in many fields, including the testing of semiconductor products. Typical SMU designs include a voltage or current source with integrated voltage and current measurement capabilities. A device under test (DUT) is typically coupled to the SMU and then stimulated with either the voltage or current source.

There are several ways in which the current through a DUT may be measured. For example, a shunt ammeter may be used to simply sense the voltage across a resistor $R_S$. $R_S$ must be kept small to not cause a large burden voltage to the input signal. A low noise gain stage is typically required to amplify the burden voltage so it can be measured.

One of the most common ammeters is the feedback ammeter. FIG. 1 illustrates an example of a typical feedback ammeter 100 configured with a high gain operational amplifier (op-amp) A to pull an input 102 through a resistor $R_S$. The op-amp A keeps the burden voltage low because of its high DC gain (e.g., typically greater than 1 million). This allows $R_S$ to be larger, thus allowing the output signal 104 to be larger.

However, a significant problem with the feedback ammeter is that it is generally prone to instability with capacitive loads. A variation of the feedback ammeter called an active shunt has been developed, in which the input-impedance is resistive from DC to the bandwidth of the op-amp, $\omega_1$.

An active shunt ammeter configuration generally replaces the op-amp used in the feedback ammeter with a fixed gain amplifier. The result is a gain that is constant to higher frequencies. At the frequency the amplifier begins to roll off, the capacitor impedance ($1/j\omega C_s$) is designed to have a magnitude that equals $R_S$. The roll off of the parallel impedance of $R_S$ and $C_s$ combined with the roll off the amplifier's gain, results in an input-impedance of the ammeter that is constant across the entire bandwidth of the amplifier. The result is a shunt like ammeter with higher output signal vs. burden voltage than a traditional shunt ammeter and none to the stability issues of feedback ammeters.

FIG. 2A illustrates an active shunt ammeter design 200 using a controlled negative gain across a parallel RC feedback element 202 such that input impedance of the circuit is a resistance equal to the R divided by the gain. In this example, the active shunt ammeter 200 includes a fixed gain differential amplifier 208 with a parallel resistor 204 and capacitor 206 connected between the negative-input and output terminals of the fixed gain differential amplifier 208. The RC product of resistor 204 and capacitor 206 is selected to equal to the amplifier's gain-bandwidth divided by the fixed gain.

FIG. 2B is a graph showing the gain B(s) of the fixed gain amplifier 208 as well as other parameters. In general, the gain B(s) (shown by reference number 250) of fixed gain amplifier 208 remains essentially constant from DC until a target frequency 252. Once the target frequency 252 is reached, the gain B(s) of the fixed gain amplifier 208 rolls off, e.g., at 20 db per decade. In this example, the operational amplifier 210 in FIG. 2A has a gain A(s) that is much higher than B(s). However, operational amplifier 212 functions as an inverter in the feedback path yielding the composite gain B(s) for the fixed gain amplifier 208. This configuration provides a controlled negative gain across the parallel RC feedback element 204, 206 such that the input impedance of the circuit is a resistance equal to the $R_S$ divided by the gain.

In FIG. 2A, $\omega_t$ is the gain bandwidth of the operational amplifier 210. Also shown in FIG. 2A is the resistance of resistor 204 ($R_s$) which remains constant over the frequency range shown. Also shown in FIG. 2A is the input impedance $Z_{in}$ of the active shunt ammeter 200. In general, the input impedance $Z_{in}$ configured to be significantly less than $R_S$ and to appear to be resistive in nature for frequencies less than and equal to $\omega_t$. In this example: $Z_{in}=R_s*(R_1/(R_1+R_2))$ and $Cs \sim R_2/(\omega_t*R_s*R_1)$.

If the feedback element 202 was resistive only, i.e., if capacitor 206 was omitted, the input impedance $Z_{in}$ would increase with frequency after the target frequency 252. The impedance of capacitor 206 may be selected to equal the impedance of the resistor at the target frequency 252. This causes the impedance of the feedback element 202 to drop at the same frequency the operational amplifier 210 begins to roll off. This configuration yields a flat input impedance that does not increase after the target frequency 252 as shown in FIG. 2B.

SUMMARY

Certain implementations of the disclosed technology include a nested ammeter suitable for measuring the electrical current flowing through a device under test (DUT). The nested ammeter may include an input configured to receive an input signal having a frequency within a frequency band and representing the current flowing through the DUT. An output may be configured to generate an output voltage representing the current flowing through the DUT.

Certain implementations of the disclosed technology include a method of measuring the electrical current flowing through a device under test (DUT) that includes receiving an input signal having a frequency within a frequency band and representing the current flowing through the DUT. The method may also include generating an output voltage representing the electrical current flowing through the DUT.

DETAILED DESCRIPTION

Embodiments of the disclosed technology generally pertain to electrical measurement equipment and, more particularly, to a nested ammeter suitable for use in measuring electrical current.

Figure 1:
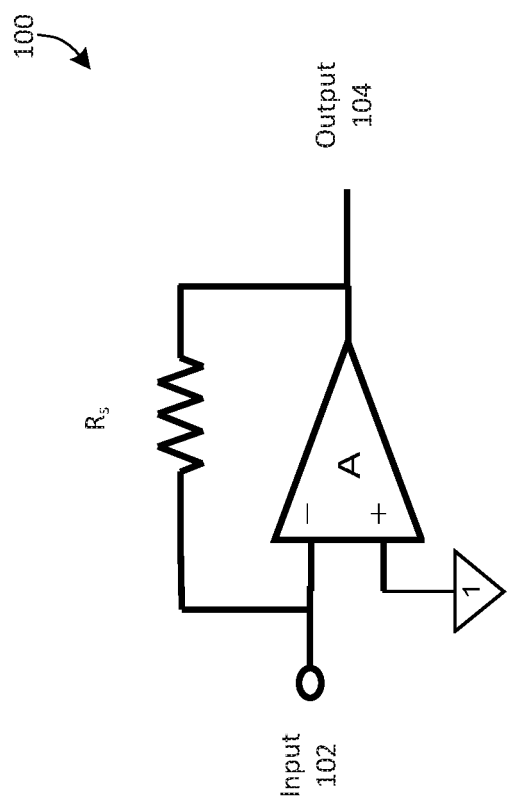
FIG. 1 illustrates an example of a feedback ammeter configured with a high gain op-amp to pull the input circuit through a resistor $R_S$.
Figure 2A:
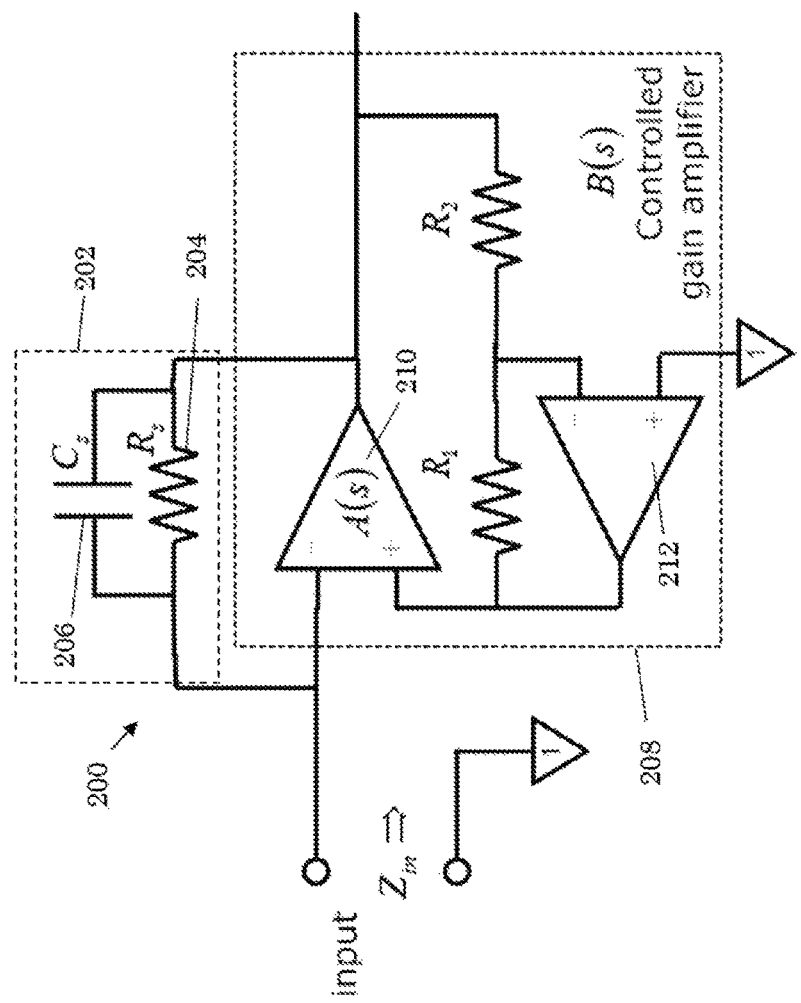
FIG. 2A illustrates an example of an active shunt ammeter design using a controlled negative gain across a parallel RC feedback element.
Figure 2B:
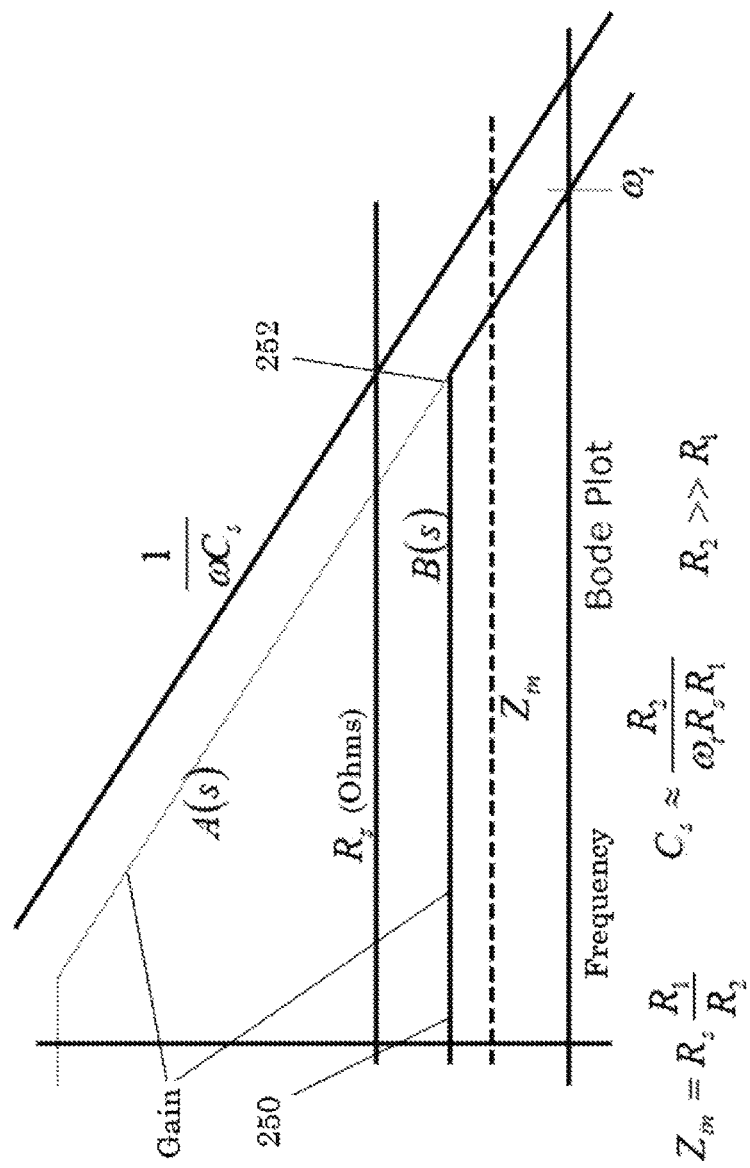
FIG. 2B is a graph showing the gain B(s) of the fixed gain amplifier of the active shunt ammeter illustrated by FIG. 2A.
Figure 3:
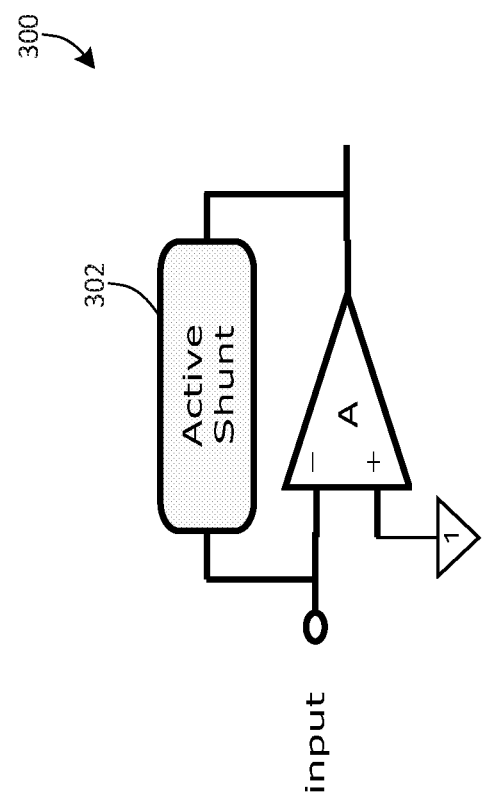
FIG. 3 illustrates an example of a feedback ammeter design in which an active shunt is used as the resistive feedback element in accordance with certain embodiments of the disclosed technology.

FIG. 3 illustrates an example of a feedback ammeter design 300 in which an active shunt 302 is used as the resistive feedback element in accordance with certain embodiments of the disclosed technology. This configuration generally results in a more stable behavior for the same value sense resistor.

Figure 4:
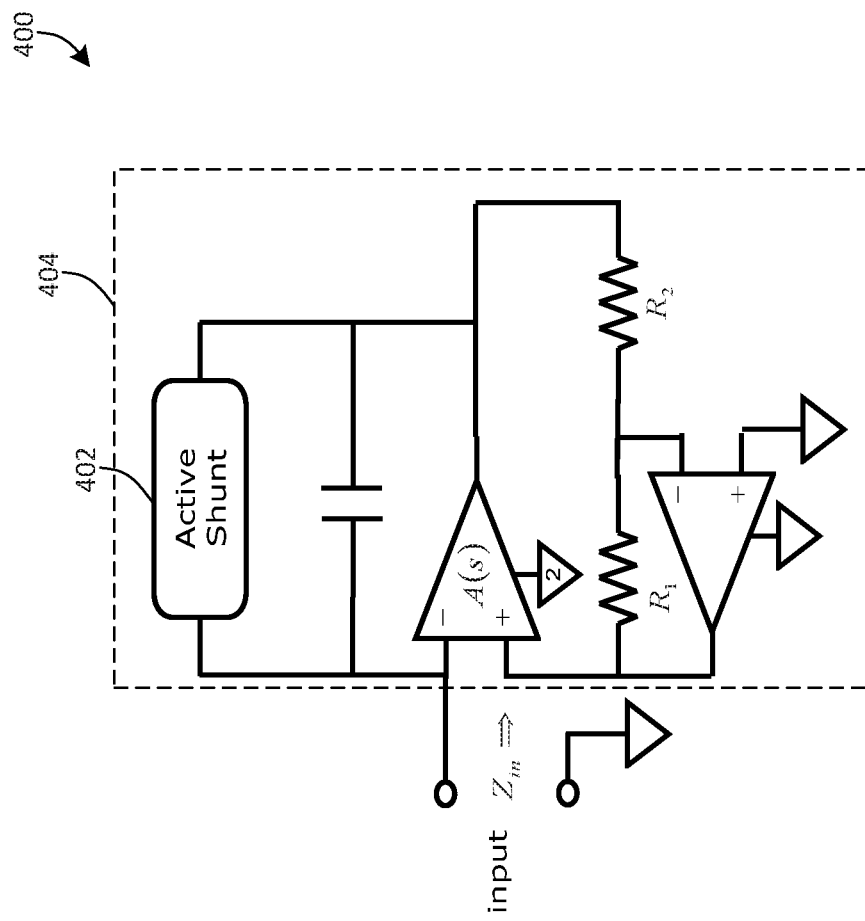
FIG. 4 illustrates an example of a nested ammeter with an active shunt using a second active shunt as its resistive feedback element in accordance with certain embodiments of the disclosed technology.

FIG. 4 illustrates a first example of a nested ammeter configuration 400 in accordance with certain embodiments of the disclosed technology. In the example, an active shunt 404 can use another active shunt 402 as its feedback resistance. This results in an ammeter (i.e., a current-to-voltage converter) having a reduced input resistance. That is, the current sense resistor is reduced by the gains of both active shunt loops 402, 404. For example, if each active shunt has a loop gain of 100, the current sense resistor, $R_s$, appears to the input as $R_s/(100\times100)$. The result is a very low input impedance ammeter that is stable with virtually any size capacitive load. Thus, in the example, $Z_{in}=R_s/(100\times100)$.

Figure 5:
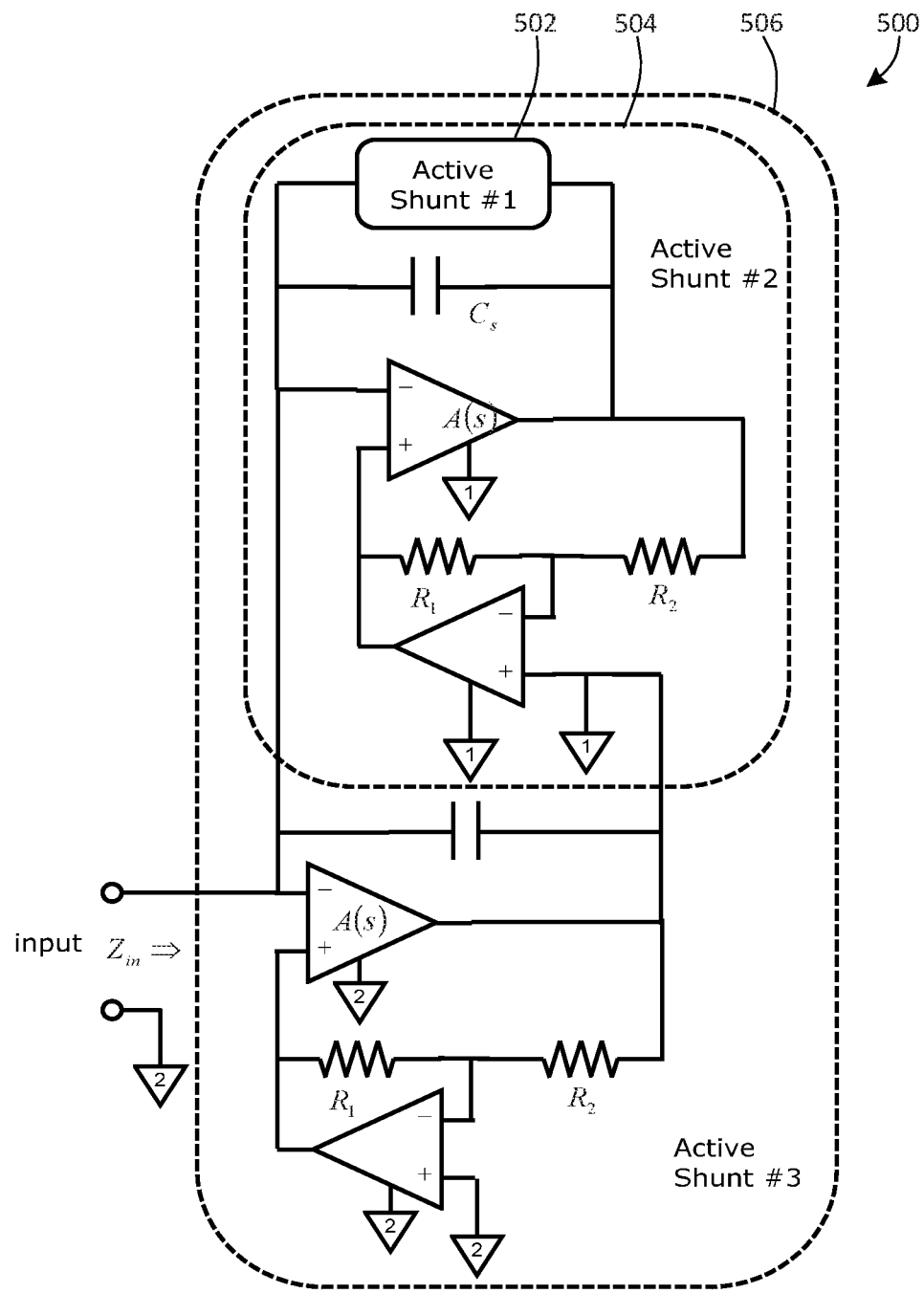
FIG. 5 illustrates an example of a nested ammeter using three active shunts where the $1^{st}$ active shunt is in the feedback of the $2^{nd}$ active shunt which is in the feedback of the $3^{rd}$ active shunt in accordance with certain embodiments of the disclosed technology.

Such configurations can be taken even further with the implementation of additional levels of nesting. For example, FIG. 5 illustrates a second example of a nested ammeter configuration 500 in accordance with certain embodiments of the disclosed technology in which an active shunt 502 is nested within another active shunt 504 that is nested in yet another active shunt 506. One having ordinary skill in the art will appreciate that such nesting of active shunts can be taken to virtually any order. If each active shunt has a gain of ×100 and Rs is the actual resistor in the feedback of active shunt #1, then $Z_{in}=R_s/(100\times100\times100)$.

Figure 6:
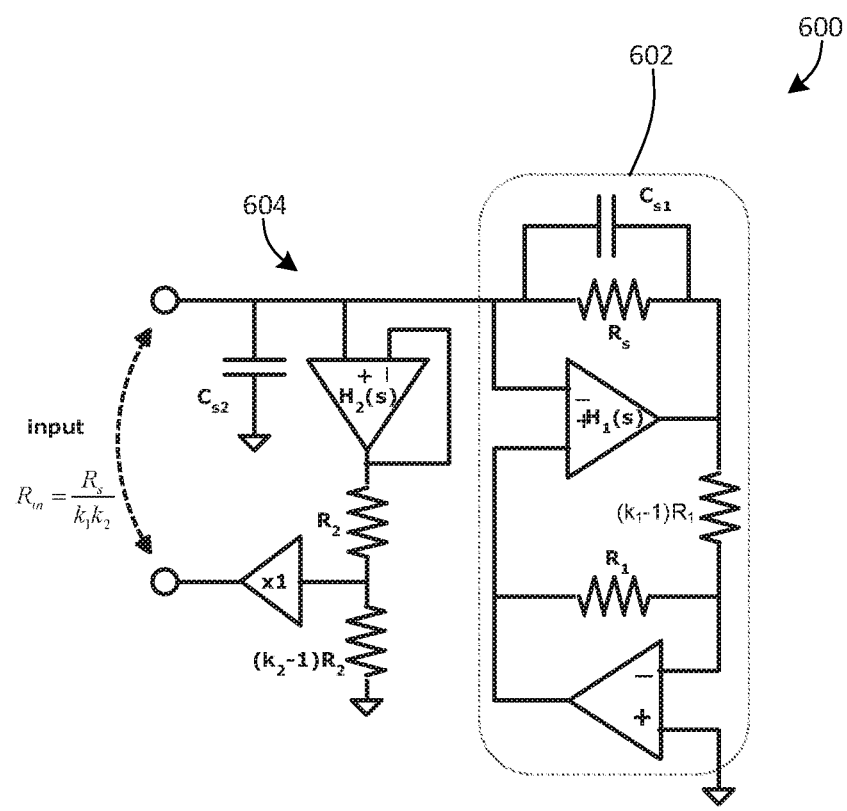
FIG. 6 illustrates an example of a nested ammeter in which an active shunt is the resistive element of another active shunt where both active shunts share a power supply in accordance with certain embodiments of the disclosed technology.

FIG. 6 illustrates an example of a nested ammeter 600 in which an active shunt 602 is the resistive element of another active shunt 604 where both active shunts 602, 604 share a power supply in accordance with certain embodiments of the disclosed technology. In the example, $Z_{in}=R_{in}=R_s/k_1k_2$, where $k_1$ and $k_2$ are the gain of the active shunts.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. An ammeter for measuring current flowing through a device under test (DUT), the nested ammeter comprising:
   an input configured to receive an input signal having a frequency within a frequency band and representing the current flowing through the DUT;
   an output configured to generate an output voltage representing the current flowing through the DUT;
   a first operational amplifier (op-amp) electrically coupled between the input and the output; and
   a first active shunt electrically coupled with the first op-amp and used as a resistive feedback element for the ammeter, wherein the first active shunt includes a second op-amp, and wherein the first active shunt includes a second active shunt electrically coupled with the second op-amp and used as a resistive feedback element for the first active shunt.

2. The ammeter of claim 1, further comprising a capacitor electrically coupled in parallel with the first active shunt.

3. The ammeter of claim 1, wherein the second active shunt includes a third op-amp.

4. The ammeter of claim 3, wherein the second active shunt includes a third active shunt electrically coupled with the third op-amp and used as a resistive feedback element for the second active shunt.

5. The ammeter of claim 4, wherein the third active shunt includes a fourth op amp.

6. The ammeter of claim 4, further comprising a capacitor electrically coupled in parallel with the third active shunt.

7. The ammeter of claim 1, further comprising a capacitor electrically coupled in parallel with the second active shunt.

8. The ammeter of claim 1, wherein the first active shunt and second active shunt share a common power supply.

9. An ammeter for measuring current flowing through a device under test (DUT), the nested ammeter comprising:
   an input configured to receive an input signal having a frequency within a frequency band and representing the current flowing through the DUT;
   an output configured to generate an output voltage representing the current flowing through the DUT;
   a first operational amplifier (op-amp) electrically between the input and the output;
   a first active shunt electrically coupled with the first op-amp and used as a resistive feedback element for the ammeter; and
   a second active shunt nested within the first active shunt, wherein the second active shunt is used as a resistive feedback element for the first active shunt.

10. The ammeter of claim 9, further comprising a capacitor electrically coupled in parallel with the first active shunt.

11. The ammeter of claim 10, wherein the capacitor is a first capacitor, further comprising a second capacitor coupled in parallel with the second active shunt.

* * * * *